United States Patent [19]

Munt

[11] 4,383,246
[45] May 10, 1983

[54] METHOD OF AND APPARATUS FOR SIGNALING THE END POINTS OF THE RAMP-DOWN INTERVAL IN A DUAL RAMP ANALOG TO DIGITAL CONVERTER

[75] Inventor: Irwin Munt, Springfield, N.J.

[73] Assignee: Sangamo Weston, Atlanta, Ga.

[21] Appl. No.: 272,371

[22] Filed: Jun. 10, 1981

[51] Int. Cl.³ .............................................. H03K 13/70
[52] U.S. Cl. ...................... 340/347 NT; 340/347 AD
[58] Field of Search ................. 340/347 AD, 347 NT, 340/347 M, 347 C; 324/99 D

[56] References Cited

U.S. PATENT DOCUMENTS

| | | | |
|---|---|---|---|
| 3,051,939 | 8/1962 | Gilbert | 340/347 |
| 3,316,547 | 4/1967 | Ammann | 340/347 |
| 3,749,894 | 7/1973 | Avdeef | 235/150.52 |
| 3,750,146 | 7/1973 | Lucas | 340/347 NT |
| 3,906,486 | 9/1975 | Phillips | 340/347 NT |
| 4,057,796 | 11/1977 | Hoogendoorn et al. | 340/347 AD |
| 4,074,257 | 2/1978 | Henry | 340/347 NT |
| 4,217,543 | 8/1980 | Strong | 324/62 |

OTHER PUBLICATIONS

Watson "Electronics Industry" Dec. 1976 pp. 21–25.
Intersil Application Note–Mar. 23, 1981.

*Primary Examiner*—C. D. Miller
*Attorney, Agent, or Firm*—Lowe, King, Price & Becker

[57] ABSTRACT

In an integrated circuit type dual ramp analog to digital converter (10), the duration of the reference voltage integration, or ramp-down period, is precisely determined to control count accumulation in an external output counter (32a) operating in parallel with the standard internal counter of the integrated circuit. A reference voltage is stored on a flying capacitor (50) that is polarity switched, depending upon the polarity of the input signal, to be applied to the input of an integrator (12) during the ramp-down period. To establish the beginning and end of ramp-down, one end (52) of the flying capacitor (50) is applied to a comparator (54). As the voltage at the monitored end of the flying capacitor (50) undergoes abrupt level changes at the end points of the ramp-down interval, the comparator (54) generates start and stop pulses to the external output counter (32a).

2 Claims, 18 Drawing Figures

METHOD OF AND APPARATUS FOR SIGNALING THE END POINTS OF THE RAMP-DOWN INTERVAL IN A DUAL RAMP ANALOG TO DIGITAL CONVERTER

FIELD OF THE INVENTION

The present invention relates generally to analog to digital converters and more particularly toward dual ramp converters and circuitry for precisely controlling output count during the ramp down interval.

BACKGROUND ART

Various conventional analog to digital (A/D) converters provide a digital signal that is representative of the instantaneous magnitude of an applied voltage. In one type of A/D converter, for example, the input voltage is applied to a voltage to frequency converter, and the frequency of the output signal is measured by counting output pulses over a fixed time interval. Examples of A/D converters of this and other types are described in Chapter 14 of Wobschall, Darold, *Circuit Design for Electronic Instrumentation*, McGraw Hill, 1979.

In another type of A/D converter, termed a "ramp converter" the input analog waveform is applied to an integrator. Following initialization of the integrator, the integrator generates a ramp voltage having a slope that is a function of the input voltage magnitude as well as of the time constant of the integrator. The instantaneous magnitude of the ramp voltage is compared in a comparator with a reference voltage. The output of the comparator controls a gate which supplies pulses generated by a clock source to an output counter that provides a pulse count proportional to input voltage magnitude. Because the slope of the ramp is a function of the size of the capacitance as well as of the magnitude of the input voltage, single ramp converters require a precision, high quality integration capacitor, such as one made of polystyrene or polypropolene which is expensive. Even with such precision components, however, the accuracy of single ramp converters tends to be sufficient for critical applications such as in laboratory volt meters.

Dual ramp converters have conversion accuracies that are higher than those possible with single ramp converters since the conversion count is independent of the time const. and clock freq. Conversion takes place in two phases, the first phase wherein the input voltage being measured is applied to the integrator to up-ramp and the second phase wherein a reference voltage of polarity opposite that of the input voltage is applied to the integrator to down-ramp. The time required for the integrator output to return to zero or other predetermined reference during ramp-down is monitored by a comparator which controls pulse count in an accumulator. The advantage of the dual slope converter over the single slope converter is that accuracy depends substantially only on the accuracy of the reference voltage source and, as mentioned above, not on the accuracy of the integrating capacitor.

Implicit in the dual slope strategy, however, is that the output accumulator or counter must be precisely controlled to accumulate pulses only during the ramp-down interval. Accordingly, one object of the present invention is to provide an analog to digital converter that is highly accurate and does not require high stability components or complex circuitry.

Another object is to provide a dual ramp analog to digital converter, wherein the ramp-down interval is precisely determined to control output pulse count.

Conventional dual ramp converters, such as the type shown in Ammann U.S. Pat. No. 3,316,547, require an analog signal source for supplying the voltage to be measured to one input of an integrator during ramp-up and a reference voltage source to be applied to the integrator during ramp-down. Because the reference voltage must have a polarity opposite that of the input voltage, as explained above, the basic dual ramp converter is operative only with single polarity input voltages. To be operative with dual polarity sources, the polarity of the input signal at the end of the ramp-up interval must be measured and the polarity of the reference adjusted during the ramp-down interval to be opposite that of the input voltage. To provide reference voltage polarity reversal, a circuit known as a "flying capacitor" has previously been developed, wherein, during an initialization interval, a reference or flying capacitor is charged from the supply voltage. During ramp-up, the flying capacitor is disconnected from the supply source and allowed to "float" and thereafter, during the ramp-down interval, the capacitor is connected, with polarity opposite the polarity input voltage, to the integrator.

To further complicate circuit requirements, in precision instrumentation, particularly when such instrumentation is interfaced with other equipment, the analog circuitry including the integrator and comparator is electrically isolated from the digital circuitry including the pulse counter or accumulator and digital display. In prior art of which I am aware, the generation of start and stop pulses to be applied to control pulse accumulation in an external counter during the ramp-down interval has been imprecise in dual slope converters of this kind. These converters contain an internal counter used for timing or controlling switching between the integrator inputs and to accumulate counts during ramp-down, and thereafter to store count accumulation in registers for decoding. An external counter electrically isolated from the converter makes the pulse count derived by the converter available to external equipment, and to control data format. In converters incorporated within large scale integrated circuits containing both analog and digital signal processing, intermediate signals are not available to control pulse accumulation in an external counter. Even an error on the order of one or two percent is intolerable in precision instrumentation, such as laboratory volt meters. It is therefore necessary to derive external counter start and stop signals in integrated circuit type, dual slope A/D converters where such signals are not directly available.

Another object of the invention, therefore, is to provide precise control of the pulse count stored externally in a counter during ramp-down in dual slope comparators of the dual polarity type.

Another object is to provide precise pulse count accumulation during ramp-down in dual slope accumulators of the type using a "flying capacitor" to establish a dual polarity reference from a single polarity voltage source.

Another object is to provide precise pulse count control during ramp-down in a dual ramp comparator of the type wherein a dual polarity reference voltage is obtained from a single polarity source using a "flying capacitor" and wherein the analog and digital circuits are electrically isolated from each other.

DISCLOSURE OF INVENTION

A method of and apparatus for signaling the end points of the ramp-down interval in a flying reference capacitor type, dual slope analog to digital converter to precisely control output pulse count comprises a comparator that is responsive to the voltage at one end of the reference capacitor to generate trigger pulses to be used to control start and stop of counting of an output accumulator. The flying capacitor is connected to a reference voltage source through a first set of switches. The integrator is connected to receive an input voltage to be measured through a second set of switches and to receive the reference capacitor voltage through a third set of switches. During each measurement cycle, the converter is controlled by the switches to operate in three successive modes: initialization, ramp-up and ramp-down.

During initialization, the first set of switches is closed to charge the capacitor to the reference voltage; the second set of switches is open. During ramp-up, the first pair of switches is opened resulting in the reference voltage floating on the capacitor; simultaneously the second set of switches is closed to supply the input voltage to the integrator to develop a ramp-up voltage. Finally, during ramp-down, the second set of switches is closed and the third set controlled to apply the voltage stored on the flying capacitor at a polarity opposite that of the input voltage polarity to the input of the integrator. Following ramp-down, the second and third sets of switches are open and the first set of switches is closed to re-initialize the integrator and start a new measurement cycle. Abrupt changes in the voltage on the flying capacitor that occur at the beginning and end of the ramp-down interval are detected by the comparator to develop start count and stop count trigger pulses applied to the output accumulator.

Still other objects and advantages of the present invention will become readily apparent to those skilled in this art from the following detailed description, wherein I have shown and described only the preferred embodiments of the invention, simply by way of illustration of the best mode contemplated by me of carrying out my invention. As will be realized, the invention is capable of other and different embodiments, and its several details are capable of modification in various, obvious respects, all without departing from the invention. Accordingly, the drawings and description are to be regarded as illustrative in nature, and not as restrictive.

BEST MODE FOR CARRYING OUT THE INVENTION

Figures 1, 2A, 2B, 2C, 2D, 2E:
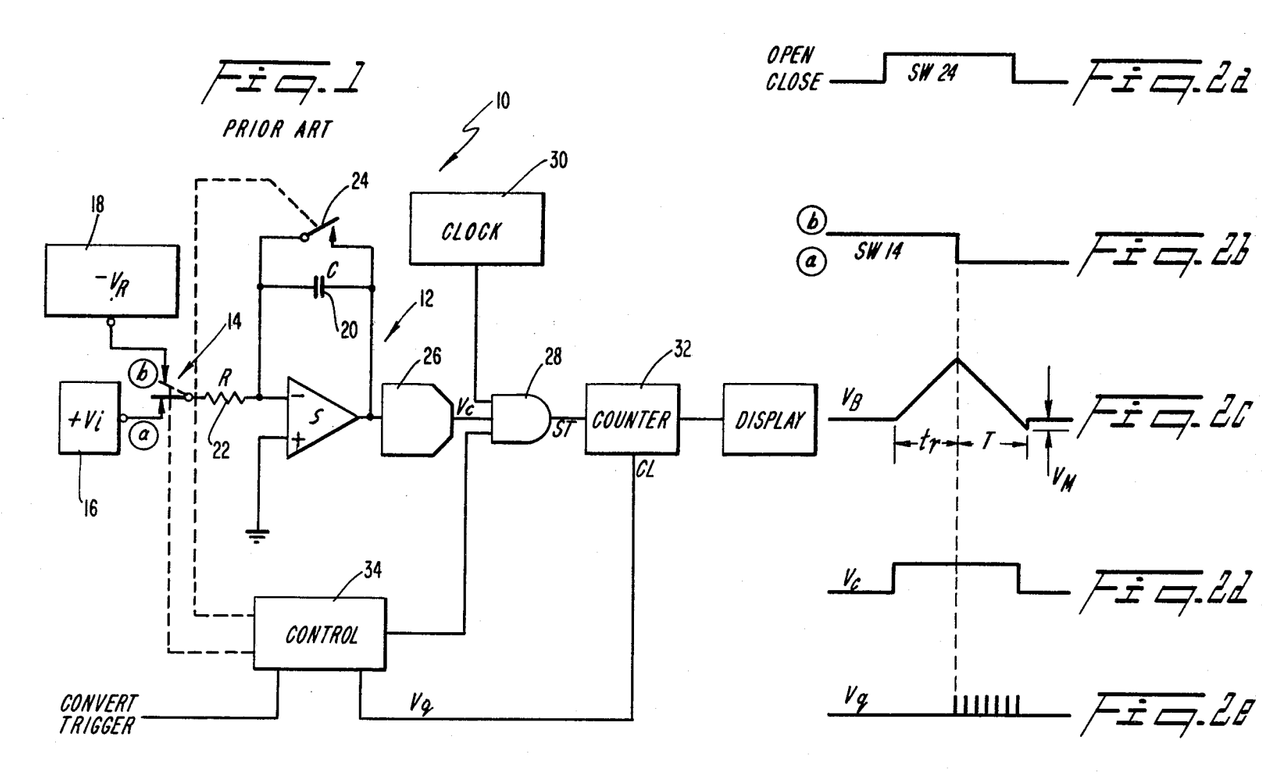
FIG. 1 is a simplified schematic diagram showing a basic dual ramp analog to digital converter of the prior art to which the principles of the present invention are applied.
FIGS. 2a–2e are waveforms illustrating the operation of the circuit of FIG. 1.

Referring to FIG. 1, a conventional dual slope type analog to digital converter 10 comprises an integrator 12 having an input that is connected through a first switch 14 selectively to an input voltage source ($+V$) 16 and a reference voltage source 18 ($V_R$) having a polarity opposite the polarity of the input source. The integrator 12 has a feedback capacitor 20 and an input resistor 22 which establish the integration time constant. A second switch 24 connected across the integration capacitor 20 resets the integrator at the beginning of each integration cycle. The output of integrator 12 is connected to a comparator 26 which compares the voltage generated by the integrated 12 with a predetermined reference voltage to control AND gate 28 to supply pulses generated by clock 30 to be accumulated in counter 32.

As is known (see Wobschall text, supra.), conventional dual ramp converter 10 performs coversion of an analog input voltage to a digital signal in two phases. During the first phase, control 34 momentarily closes switch 24 (see FIG. 2a) to reset (discharge) integration capacitor 20 and clears counter 32. The control 34 also connects switch 14 (FIG. 2b) to receive the input voltage $+V_i$ generated by source 16, as shown by the solid line of switch 14 in FIG. 1. During this phase, AND gate 28 is maintained off by the control 34. After a predetermined time $t_r$, when the integrator up-ramp output $v_B$ (see FIG. 2c) is at $-V_M$ and equals $-v_i t_r/RC$, control 34 in the second phase controls switch 14 to connect integrator 12 to reference source 18, which has a polarity opposite the polarity of input voltage source 16. Since the slope of the down-ramp voltage now generated by integrator 12 is equal to $V_R/RC$, the time required for the integrator 12 output to intersect ground voltage is $T = v_i t_r / V_R$.

The output comparator 26 maintains gate 28 on for the time interval T, so the number of pulses counted by counter 32 is $N = t_r f_c v_i / VR$, where $f_c$ is clock 30 frequency.

Since the time period $t_r$ is derived from clock frequency $f_c$ by frequency division, the count number $N_S = t_r f_c$ is known, so that $N = N_S v_i / V_R$. Thus, the output pulse count N (FIG. 2c) depends only on the magnitude of the input voltage to be measured and on the reference voltage $V_R$ in addition, of course, to clock frequency.

Figures 3, 4A, 4B, 4C, 4D:
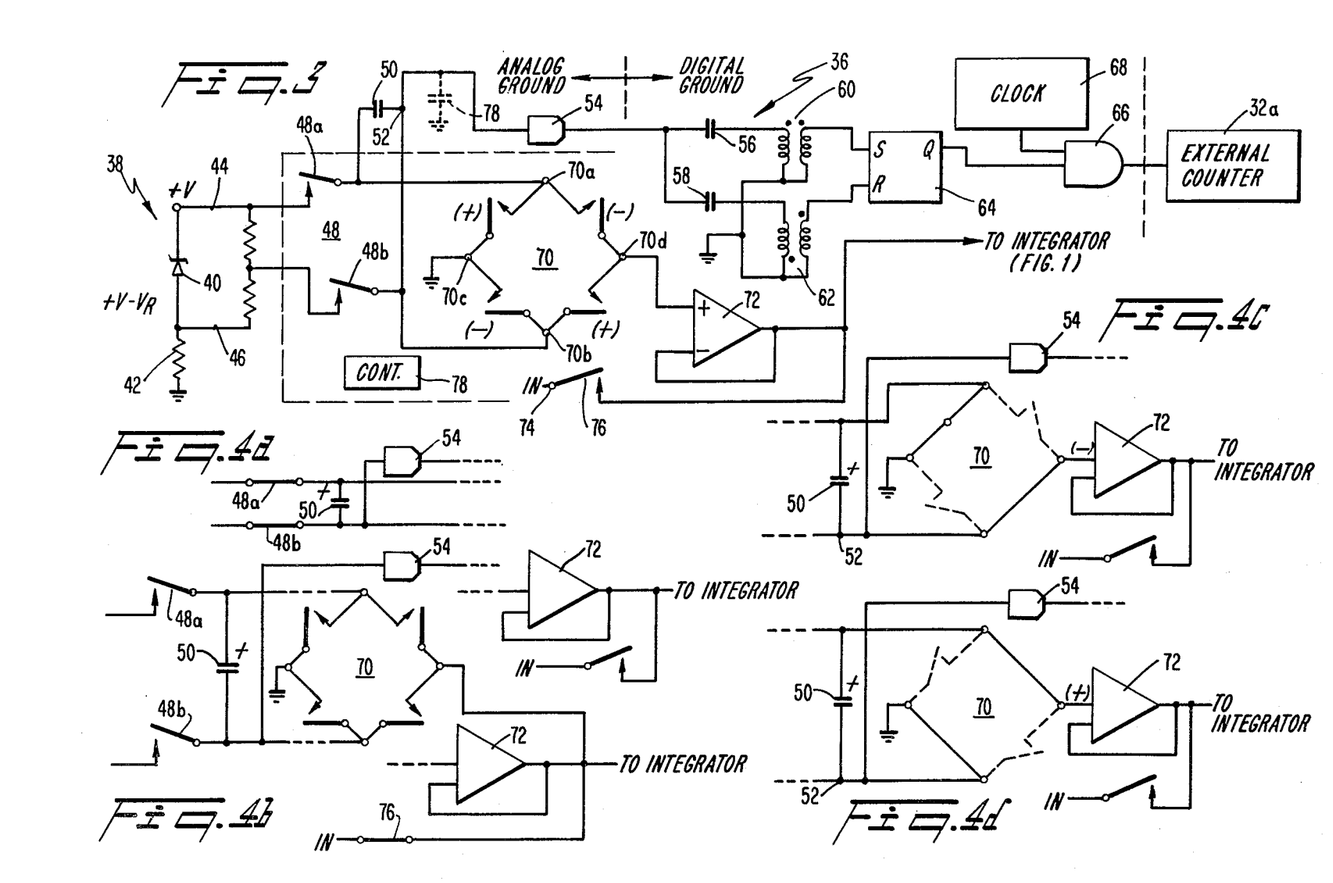
FIG. 3 is a simplified circuit diagram showing a flying capacitor type, floating reference circuit enabling the dual slope converter of FIG. 1 to be operative with input voltages of positive or negative polarity.
FIGS. 4a–4d are partial circuit diagrams explaining the operation of the circuit shown in FIG. 3.

Referring to FIG. 3, a circuit 36 in accordance with the invention is provided to operate with a conventional dual slope analog to digital converter, such as an Intersil model 7106 integrated circuit, which is of a "flying capacitor" type enabling the converter to be operative with input voltages of either a positive or a negative polarity. The circuitry within the dotted lines is provided within conventional dual ramp circuitry such as the Intersil device whereas the circuitry outside the dotted lines is provided in accordance with the invention to synchronize output pulse count precisely to the ramp-down interval. The circuit 36 is referenced to two different grounds, i.e., an analog circuit ground to which the analog signal components are connected and a digital circuit ground to which the digital signal components are connected. The two grounds are electrically isolated from each other to prevent undesirable signal coupling caused by stray ground currents.

Circuit 36 comprises a reference voltage sources 38 formed of a conventional Zener or reference diode 40 having a cathode connected to the positive supply line +V and an anode connected to analog ground through a resistor 42. The reference voltage to be applied to the dual ramp integrator (not shown in FIG. 3 but corresponding to integrator 12 in FIG. 1) is obtained across the Zener diode 40 by lines 44, 46. The reference voltage lines 44, 46 are applied, through a set of switches 48, to an external capacitor 50. Thus, one terminal 52 of capacitor 50 is applied, through switch 48a, to the positive supply line +V whereas the opposite terminal capacitor is applied, through switch 48b, to the anode of Zener diode 40. This terminal 52, is also connected to the input of a conventional comparator 54 for voltage comparison with a reference voltage that may be a positive predetermined voltage. The output of the comparator 54 is supplied to a pair of capacitors 56, 58 and pulse transformers 60, 62. The outputs of pulse transformers 60, 62 are connected, respectively, to the Set and Reset terminals of a flip-flop 64 which controls AND gate 66 to supply pulses from clock source 68 to a BCD counter (not shown but corresponding to counter 32 in FIG. 1) external to the standard integrated current chip forming, for example, the Intersil 7106 A/D converter, which counter provides an output count proportional to the magnitude of the input voltage in a conventional manner.

The set of switches 48 is also connected to a set of switches 70, arranged in a bridge configuration, with input terminals 70a, 70b and output terminals 70c and 70d. Terminal 70c is connected to analog ground whereas terminal 70d is connected, through buffer amplifier 72, to the input of the dual ramp integrator. Also connected to the input of the dual ramp comparator is the analog signal to be measured, applied at input terminal 74 and supplied to the integrator through a switch 76.

The switches 48, 70 and 76 are all controlled by a controller 78, provided within the Intersil 7106, to cause the converter to operate in three successive modes, viz, initialization, ramp-up and ramp-down, during each measurement cycle. Switches 48, 70, 76 may be, for example, FET devices that are voltage controlled by 78 to assume open and closed electrical states.

Referring to FIG. 4a, during initialization, switches 48a and 48b are closed, charging capacitor 50 to the reference voltage $V_R$. Simultaneously, although not shown in FIG. 3, the integrator is initialized and the output counter is cleared. All of the switches 70 are open to isolate the reference voltage $V_R$ from the integrator and input switch 76 is open to isolate the input voltage from the integrator.

Figure 5A:
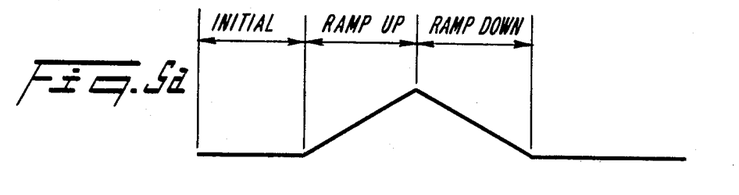
FIGS. 5a–5g are wave forms explaining the operation of the circuitry illustrated in FIGS. 4a–4d.

During ramp-up, the switches 48a, 48b are open, as shown in FIG. 4b, switches 70 are open and switch 76 is closed. Thus, the reference voltage $V_R$ on capacitor 50 floats, and the input voltage to be measured is applied to the input of the integrator to develop a ramp-up signal, as shown in FIG. 5a. After a predetermined time period, controller 78 controls switches 48, 70 and 76 to operate in a ramp-down mode, wherein the reference voltage $V_R$ floating on capacitor 15 is applied to the input of the integrator at a polarity opposite the polarity of the input voltage at terminal 74. Thus, switches 48a and 48b are maintained open, switch 76 is opened and the bridge switches 70 are controlled to apply either a positive reference voltage, as as shown in FIG. 4d, or a negative reference voltage, shown in FIG. 4c to the input of the integrator. Switches 70 are controlled in response to the polarity of the input voltage at 74 measured by conventional circuitry, not shown, at the end of the ramp-up interval. For example, referring to FIG. 4c, assuming that the input voltage at the end of the ramp-up interval is determined to be positive, a negative reference voltage is applied to the integrator to rampdown. This is provided by closing the switches between terminal 70a and 70c and between terminals 70d and 70b of the bridge 70, while maintaining the remaining two switches open, as shown in FIG. 4c. On the other hand, if the input voltage is determined to be negative, rampdown is provided by applying a positive reference voltage to the input of the integrator, as shown in FIG. 4d. This is effected by closing the switches between bridge terminals 70a and 70d and between terminals 70c and 70b, while maintaining the remaining two switches open.

Because the voltage on capacitor 50 is floating during the ramp-up and ramp-down intervals, the voltage at terminal 52 of the capacitor 50 abruptly changes at either side of the capacitor is connected to analog ground during the transitions defining the beginning and end of the ramp-down interval. These abrupt transitions are monitored by comparator 54 at capacitor terminal 52, in accordance with the invention, and converted into start and stop pulses by capacitors 56, 58 and pulse transformers 60, 62 to control the output counter to precisely control pulse count accumulation.

Figure 5B:
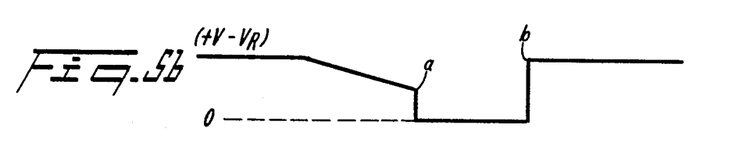
Figure 5C:
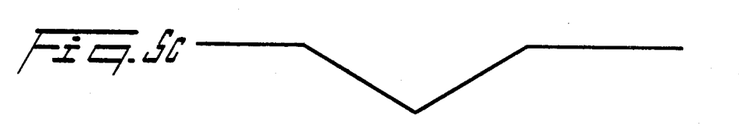
Figure 5D:
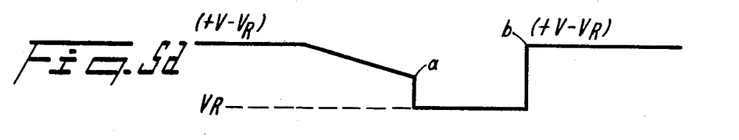

The case wherein the input voltage is negative is shown in FIGS. 5a and 5b; the case wherein the input voltage is positive is shown in FIGS. 5c and 5d. It is noted that the because integrator 12 is of a conventional inverting type, the ramp-up interval is positive in response to a negative input voltage, shown in FIG. 5a whereas the ramp-up period is negative, as in FIG. 5c in response to a positive input voltage. The voltage on terminal 52 of capacitor 50, monitored by comparator 54, is shown in FIGS. 5b and 5d for negative input and positive input voltage, respectively.

Referring to FIGS. 5b and 5d, the voltage at capacitor terminal 52 is at $(+V-V_R)$ in both the positive input voltage and negative input voltage cases. When, during the ramp-up interval, the capacitor is controlled to voltage float, the voltage on capacitor terminal 52 decays toward analog ground. The voltage dropoff at capacitor terminal 52 during float is not instantaneous because the input of the comparator 52 tends to have input stray capacitance, as shown by capacitor 78 in FIG. 3. This stray capacitance is caused by factors such as parasytic capacitance between adjacent printed circuit board leads. The stray capacitance 78 forms a voltage storage circuit with the high off resistances of the open switches 48a, 48b. The significance of the stray capacitance 78 is that, because the voltage at capacior terminal 52 is maintained near +V during the ramp-up interval when capacitor 50 is floating, there is a substantial, detectable voltage step-down at capacitor terminal 52 at the beginning of the ramp-down period, as shown at point A in FIGS. 5b and 5d.

Figure 5E:
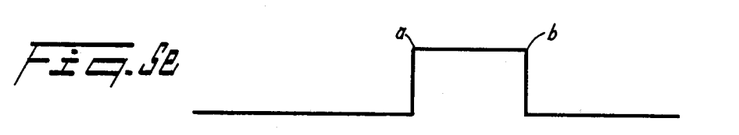

In the positive input voltage case, as shown in FIGS. 5c and 5d, the voltage across the capacitor 50 is charged to $V_R$ during the initialization interval. During the ramp-up interval, with switches 48 and 70 open, the voltage at 52 tends to decay toward analog ground, as shown in FIG. 5d. At time a, corresponding to the start of the ramp-down interval, however, the switches between bridge terminals 70a and 70c and between terminals 70d and 70b close, as shown in FIG. 4c to connect the positive terminal of capacitor 50 to ground and the negative terminal to buffer 72 to be applied to the integrator. Thus, the voltage at capacitor terminal 52 relative to analog ground, monitored by comparator 54, is abruptly stepped down to $(-V_R)$ (FIG. 5d) which is the voltage to which the capacitor was charged by Zener diode 40. This voltage step down is detected by comparator 54, and in response, generates a logic zero to logic one output voltage transition, as shown at time a in FIG. 5e. At the end of the ramp-down interval, upon initialization in preparation for another measurement cycle (time b), the voltage at capacitor terminal 52 up steps to $(+V-V_R)$ as shown in FIG. 5d. In response, the output of comparator 54 downsteps to analog ground, as shown in FIG. 5e.

Figure 5F:
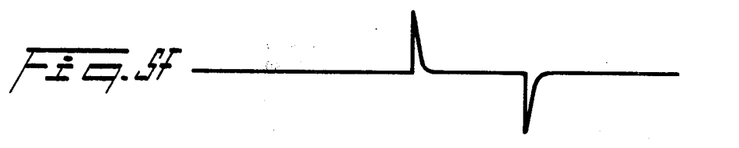
Figure 5G:
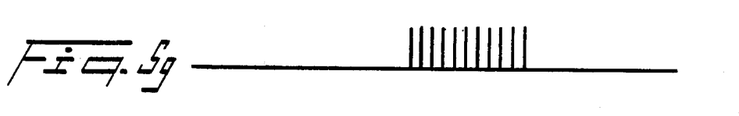

The output of comparator 54 is differentiated by capacitors 56, 58 and pulse transformers 60, 62. The differentiated voltage, shown in FIG. 5f, comprises positive and negative pulses corresponding in time to the leading and trailing edges of the squarewave generated by comparator 54 as shown in 5e. The positive pulse is coupled to Set terminal S of flip-flop 64 through capacitor 56 and pulse transformer 60. It is noted that no polarity inversion occurs in pulse transformer 60 since the pulse transformer windings are wired in common sense. The negative pulse, following polarity inversions, is coupled to reset terminal R of flip-flop 64 through capacitor 58 and pulse transformer 62; the negative pulse generated by capacitor 58 is inverted in pulse transformer 62 since the transformer windings are wired in opposite sense.

When flip-flop 64 is set, the output Q is at a logic one level, enabling AND gate 66 to pass pulses generated by clock 68 to the output counter. When the flip-flop 64 is reset, however, the output Q is at logic zero, disabling the AND gate 66. Thus, pulses are supplied to the output counter through gate 66 only during the ramp-down interval, and the counter is precisely synchronized to the start and end points of the ramp-down signal.

In the case wherein the input voltage to be measured is negative, the output signal generated by the comparator is positive during the ramp-up and ramp-down intervals, as shown in FIG. 5a. With reference to FIG. 5b, the voltage on capacitor terminal 52 is at $(+V-V_R)$ during initialization. During ramp-up, with the voltage on capacitor 50 floating (switches 48 are open) and the input voltage applied to the integrator through closed switch 76, the voltage on capacitor terminal 52 decays toward analog ground. As discussed above, the capacitor voltage decays rather than downsteps as a result of stray capacitance 78 at the input of comparator 54. At the beginning of ramp-down, the switches between bridge terminals 70a and 70d and between terminals 70c and 70b are closed, as shown in FIG. 4d, to apply a positive reference voltage $+V_R$ to the input of the integrator through buffer 72. Thus, the voltage on capacitor terminal 52 is connected directly to analog ground, as shown in FIG. 5b. In response, comparator 54 generates the squarewave signal shown in FIG. 5e. Again, at the end of the ramp-down interval the voltage on capacitor terminal 52 upsteps to $(+V-V_R)$ for initialization. The pulses developed by capacitors 56 and 58 at the output of comparator 54 are again applied to flip-flop 64 to control pulse count accumulation in the output counter. Thus, the circuit 36 shown in FIG. 3 synchronizes the output counter precisely to the ramp-down interval counter of the conventional dual slope integrator of the type employed in the Intersil integrated circuits as described above.

In this disclosure, there is shown and described only the preferred embodiment of the invention, but as aforementioned, it is to be understood that the invention is capable of use in various other combinations and environments and is capable of changes or modifications within the scope of the inventive concept as expressed herein.

For example, although the preferred embodiment of the invention has been described in connection with the Intersil 7106 integrated circuit, it is to be understood that other dual ramp analog to digital converter circuit configurations can be applied to the principles of the present invention.

I claim:

1. In an integrated circuit type dual ramp analog to digital converter of a type comprising a reference voltage source, an input terminal for receiving an input voltage to be measured, an integrator means, first switch means for connecting said capacitor means to be charged by said reference voltage source, second switch means for coupling said input signal at said input terminal to said integrator means, third switch means for coupling said capacitor means to said integrator means, such that said capacitor voltage applied to said integrator means has a polarity opposite that of said input voltage, a pulse generator, an accumulator for counting pulses generated by said pulse generator and controlling pulses generated by said pulse generator and controlling means for controlling said switch means during a measurement cycle to successively (1) close said first switch means to cause said capacitor means to be charged by said reference source, (2) open said first switch means to cause voltage on said capacitor means to be stored and close said second switch means to apply said input voltage to said integrator means to generate a ramp-up voltage and (3) open said second switch means and control said third switch means to apply said voltage stored on said capacitor means with a polarity opposite that of said input voltage to said integrator means to generate a ramp-down voltage:

means for precisely controlling start and stop times of said accumulator to obtain a pulse count proportional to said input voltage, comprising comparator means for measuring a voltage of said capacitor means and, in response, generating a trigger signal each time the magnitude of said capacitor voltage crosses the magnitude of a comparator reference voltage, and means for applying said trigger signals to control said accumulator.

2. In an integrated circuit type dual ramp analog to digital converter of a type including a voltage supply line and a ground, a reference voltage source having a first terminal connected to said supply line and a second terminal, and a capacitor means to be selectively charged by said reference source to a reference voltage, an input terminal for receiving an input signal to be measured, integrator means, switch means connected in circuit with said reference voltage source, said capacitor means and said integrator means and controlled during a measurement cycle to (1) charge said capacitor means by said reference voltage source during an initialization interval, (2) connect said integrator means to be responsive to said input voltage at said input terminal for a predetermined time interval to develop a ramp-up voltage and (3) connect said integrator means to be responsive to said reference voltage at said terminal of said capacitor means, said reference voltage, said capacitor voltage having a polarity opposite that of said input voltage to develop a ramp-down voltage, a pulse generator, and a first accumulator internal to said integrated circuit for counting pulses generated by said pulse generator, a second accumulator external to said integrated circuit for counting pulses generated by said pulse generator, a voltage on said second terminal of said capacitor indexing between upper and lower levels at the beginning and end of said ramp-down signal, means responsive to said ramp-down voltage for controlling said first and second accumulators to be responsive to said pulse generator, the improvement comprising:

comparator means for comparing the voltage of said capacitor means with a predetermined voltage having a level intermediate said upper and lower capacitor voltage levels and, in response, generating a trigger pulse each time said capacitor voltage crosses said comparator reference voltage, and means for coupling said trigger pulses to control said external accumulator to start or stop pulse count accumulation.

* * * * *

UNITED STATES PATENT AND TRADEMARK OFFICE
CERTIFICATE OF CORRECTION

PATENT NO. : 4,383,246

DATED : May 10, 1983

INVENTOR(S) : Irwin Munt

It is certified that error appears in the above-identified patent and that said Letters Patent are hereby corrected as shown below:

Column 1, lines 43 and 44, "sufficient" should read -- insufficient --.

Column 1, line 49, "time const. and clock freq." should read -- integrating capacitor. --.

Column 4, line 7, "(+V)" should read -- (+$V_i$) --.

Column 4, line 16, "integrated" should read -- integrator --.

Column 5, line 1, "sources" should read -- source --.

Column 5, line 62, "capacitor 15" should read -- capacitor 50 --.

Column 5, line 67, "as", second occurrence, should read -- is --.

Column 6, line 21, "at" should read -- as --.

Column 6, line 33, delete "the".

UNITED STATES PATENT AND TRADEMARK OFFICE
CERTIFICATE OF CORRECTION

PATENT NO. : 4,383,246

DATED : May 10, 1983

INVENTOR(S) : Irwin Munt

It is certified that error appears in the above-identified patent and that said Letters Patent are hereby corrected as shown below:

Column 6, line 48, "comparator 52" should read — comparator 54 —.

Column 6, line 55, "capacior" should read — capacitor —.

Claim 2, column 10, line 10, "or" should read — and —.

Signed and Sealed this

Eleventh Day of October 1983

[SEAL]

Attest:

Attesting Officer

GERALD J. MOSSINGHOFF

Commissioner of Patents and Trademarks